(12) United States Patent
Mori

(10) Patent No.: US 8,688,395 B2
(45) Date of Patent: Apr. 1, 2014

(54) METHOD FOR CORRECTING MEASUREMENT ERRORS AND ELECTRONIC COMPONENT CHARACTERISTICS MEASURING DEVICE

(75) Inventor: Taichi Mori, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 908 days.

(21) Appl. No.: 12/849,037

(22) Filed: Aug. 3, 2010

(65) Prior Publication Data

US 2011/0178751 A1     Jul. 21, 2011

Related U.S. Application Data

(63) Continuation of application No. PCT/JP2008/072236, filed on Dec. 8, 2008.

(30) Foreign Application Priority Data

Feb. 5, 2008   (JP) ................................. 2008-025778

(51) Int. Cl.
  *G01R 27/28*     (2006.01)
(52) U.S. Cl.
  USPC ............................................ 702/85; 324/601
(58) Field of Classification Search
  USPC ............................................ 702/85; 324/601
  See application file for complete search history.

(56) References Cited

U.S. PATENT DOCUMENTS

| 6,876,935 B2 | 4/2005 | Kamitani |
| 7,061,254 B1 | 6/2006 | Shoulders et al. |
| 2003/0120449 A1 | 6/2003 | Kamitani |
| 2007/0084035 A1* | 4/2007 | Mori et al. ................. 29/407.01 |
| 2008/0211515 A1* | 9/2008 | Mori et al. .................... 324/601 |

FOREIGN PATENT DOCUMENTS

| JP | 2003-240827 A | 8/2003 |
| JP | 3558074 B2 | 8/2004 |
| JP | 2006-242799 A | 9/2006 |

(Continued)

OTHER PUBLICATIONS

Official Communication issued in International Patent Application No. PCT/JP2008/072236, mailed on Mar. 10, 2009.
Kamitani, "A Method to Correct Difference of In-Fixture Measurements Among Fixtures on RF Devices," Asia-Pacific Microwave Conference, 2003, vol. 2, pp. 1094-1097.

(Continued)

*Primary Examiner* — John E Breene
*Assistant Examiner* — Haihui Zhang
(74) *Attorney, Agent, or Firm* — Keating & Bennett, LLP

(57) ABSTRACT

A method for correcting measurement errors and an electronic component characteristics measurement device improve correction precision by eliminating correction errors caused by leakage signal components between ports of the measurement jigs. An equation that correlates measurement values in a test measurement jig mounted state with measurement values in a standard measurement jig mounted state is determined from a result of measuring electrical characteristics of correction data obtaining samples having different electrical characteristics from each other in a state in which they are mounted on a standard measurement jig and on a test measurement jig. The equation is an equation that assumes the presence of leakage signals that are directly transmitted between at least two ports of at least one of the standard measurement jig and the test measurement jig. By using the equation determined by measuring the electrical characteristics on an arbitrary electronic component in a state in which it is mounted on the test measurement jig, the electrical characteristics that would be obtained if measured on the electronic component in a state in which it is mounted on the standard measurement jig are calculated.

6 Claims, 9 Drawing Sheets

(56) References Cited

FOREIGN PATENT DOCUMENTS

| | | |
|---|---|---|
| JP | 2006-317448 A | 11/2006 |
| JP | 2008-064601 A | 3/2008 |
| TW | I230260 B | 4/2005 |
| TW | 200739093 A | 10/2007 |

OTHER PUBLICATIONS

Dunsmore et al., "New Methods for Correlating Fixtured Measurements," Asia-Pacific Microwave Conference, 2003, vol. 1, pp. 568-571.

Official Communication issued in corresponding Korean Patent Application No. 10-2010-7017109, mailed on Oct. 5, 2011.

* cited by examiner

FIG. 5A  No. 1  
FIG. 5B  No. 2  
FIG. 5C  No. 3  
FIG. 5D  No. 4  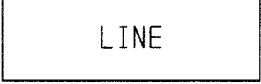
FIG. 5E  No. 5  

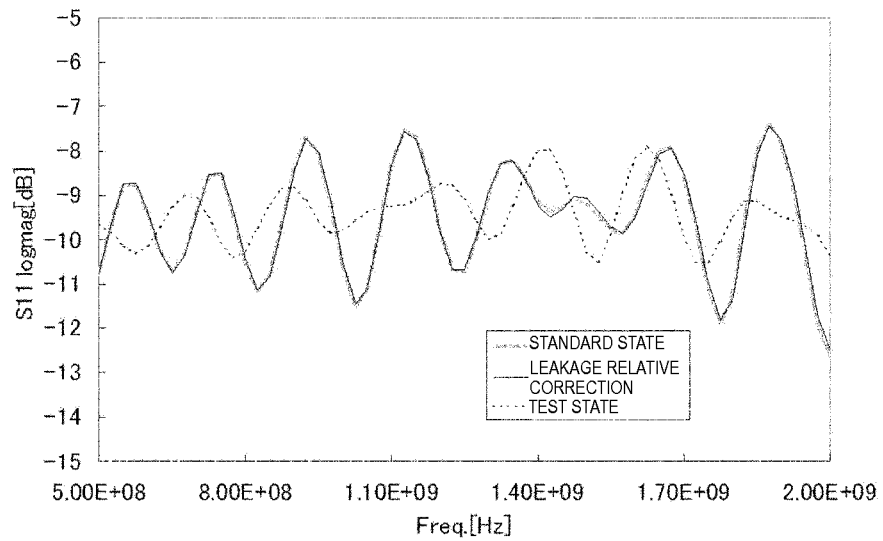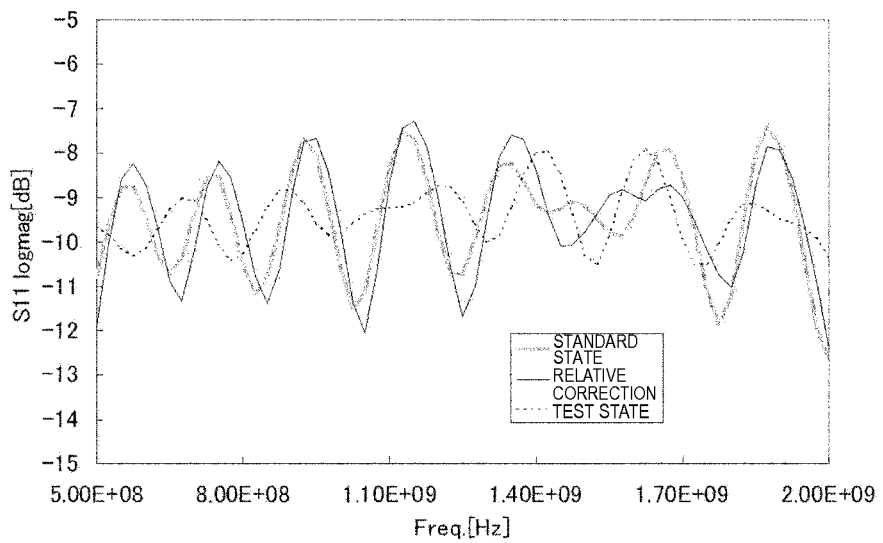

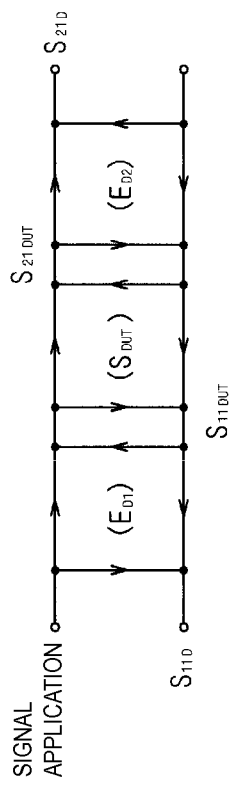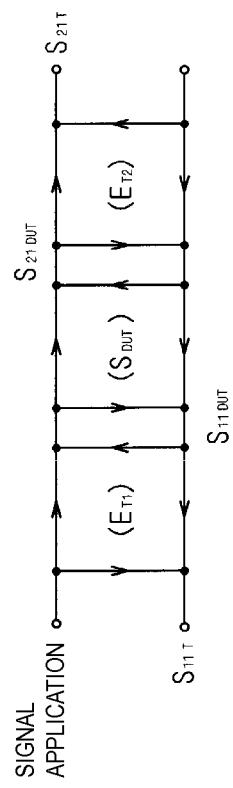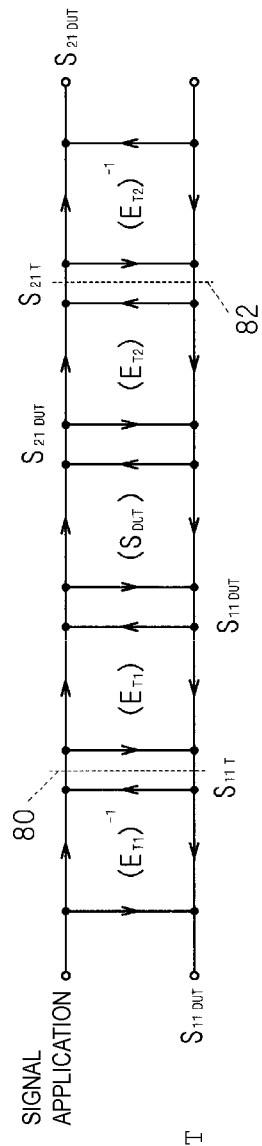
FIG. 9A
PRIOR ART
FIG. 9B
PRIOR ART
FIG. 9C
PRIOR ART

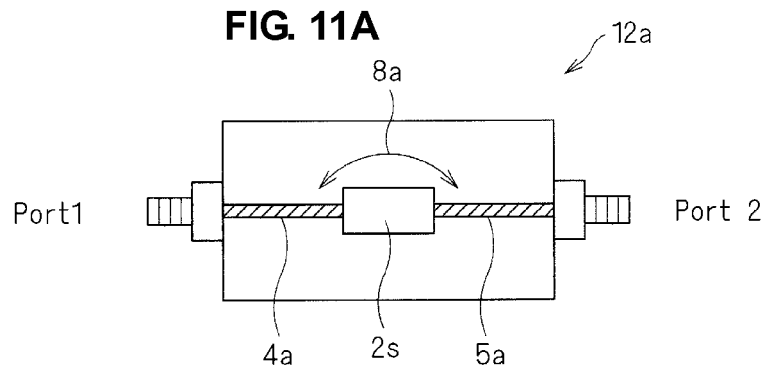
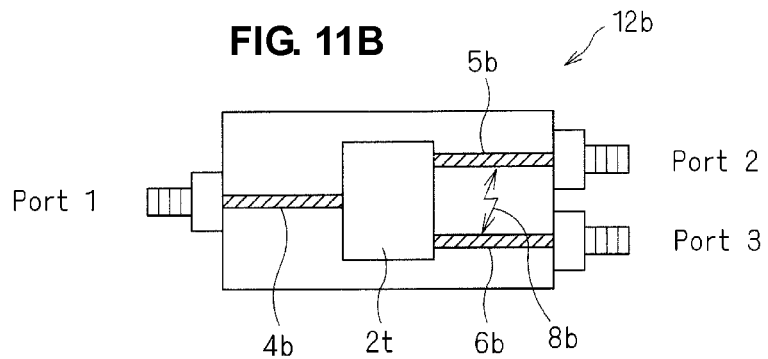

METHOD FOR CORRECTING MEASUREMENT ERRORS AND ELECTRONIC COMPONENT CHARACTERISTICS MEASURING DEVICE

BACKGROUND OF THE INVENTION

1. Field of the Invention

The present invention relates to a method for correcting measurement errors and an electronic component characteristics measuring device. More particularly, the present invention relates to a method for correcting measurement errors and an electronic component characteristics measuring device that calculate an estimated value of electrical characteristics that would be obtained if measured in a state in which an electronic component is mounted on a standard measurement jig from a result of measuring the electrical characteristics in a state in which the electric component is mounted on a test measurement jig.

2. Description of the Related Art

Conventionally, an electronic component that does not have a coaxial connector, such as a surface-mounting type electronic component, may be mounted on a measurement jig having a coaxial connector, and the measurement jig may be connected to a measuring device via a coaxial cable, so as to measure the electrical characteristics. In such a measurement, variations in the characteristics among individual measurement jigs and variations in the characteristics among individual coaxial cables and measurement devices cause measurement errors.

In a coaxial cable and a measurement device, by connecting a standard device having standard characteristics to the measuring device via the coaxial cable for making measurements, the errors on the side closer to the measuring device than the tip end of the coaxial cable connected to the standard device can be identified.

However, in a measurement jig, it is not possible to identify precisely the errors of electrical characteristics between the connection terminal of the portion on which the electronic component is mounted and the coaxial connector for connecting to the coaxial cable. Also, it is not easy to make adjustments so that the characteristics among the measurement jigs are equal or substantially equal to each other. In particular, it is extremely difficult to adjust the measurement jigs so that the characteristics among the measurement jigs are equal or substantially equal to each other in a large bandwidth.

Therefore, a relative correction method is desired in which correction data obtaining samples are mounted on a plurality of measurement jigs for making measurements, and an equation that corrects the relative errors between a certain measurement jig (hereinafter, referred to as a "standard measurement jig") and another measurement jig (hereinafter, referred to as a "test measurement jig") is determined in advance from the variations in the measurement values among the measurement jigs, whereby, from a measurement value of electrical characteristics of an arbitrary electronic component obtained in a state in which the electronic component is mounted on the test measurement jig, an estimated value of the measurement value that would be obtained if measured in a state in which the electronic component is mounted on the standard measurement jig is calculated using this equation.

For example, the standard measurement jig is used to ensure electrical characteristics to users, and the test measurement jig is used to measure and select good products in a step of manufacturing electronic components.

Specifically, for each port, a scattering matrix obtained by synthesizing a scattering matrix $S_T$ that removes test measurement jig errors with a scattering matrix of standard measurement jig errors (this is referred to as a "relative correction adaptor") is determined. By synthesizing the relative correction adaptor with a scattering matrix of a test measurement jig measurement value, an estimated value of the standard measurement jig measurement value is calculated. The relative correction adaptor can be calculated from a result of measuring at least three one-port correction data obtaining samples (such as Open, Short, and Load) in both of the standard measurement jig and the test measurement jig for each port (see, for example, Japanese Patent No. 3558074, GAKU KAMITANI (Murata Manufacturing Co., Ltd.) "A METHOD TO CORRECT DIFFERENCE OF IN-FIXTURE MEASUREMENTS AMONG FIXTURES ON RF DEVICES" APMC Vol. 2, pp. 1094-1097, 2003, and J. P. DUNSMORE, L. BETTS (Agilent Technologies) "NEW METHODS FOR CORRELATING FIXTURED MEASUREMENTS" APMC Vol. 1, pp. 568-571, 2003).

However, the above-described relative correction adaptor does not treat leakage signal components that are directly transmitted between the ports of measurement jigs and are not transmitted to the electronic component connected between the ports as a factor to be corrected. For this reason, correction errors will remain due to the leakage signal components that are present in a significant amount in the measurement jigs.

Such correction errors necessitate an increase in the margin for determining good or bad products in the selection step by the amount of the correction errors, thereby causing a decrease in the yield ratio.

Moreover, according as the continued reduction in the size of electronic components, the distance between the ports will be reduced, and the leakage signal components of the measurement jigs for measuring the electronic components will be increased, whereby the correction errors will also inevitably increase. For this reason, it will not be sufficient to merely increase the margin for determining good or bad products, leading to a possibility that the determination of good or bad products itself cannot be performed in the selection step.

SUMMARY OF THE INVENTION

To overcome the problems described above, preferred embodiments of the present invention provide a method for correcting measurement errors and an electronic component characteristics measurement device that improve correction precision by eliminating correction errors caused by leakage signal components between ports of the measurement jigs.

A preferred embodiment of the present invention provides a method of correcting measurement errors by calculating, from a result of measuring electrical characteristics in a state in which an electronic component having arbitrary n ports including two or more ports is mounted on a test measurement jig, an estimated value of the electrical characteristics that would be obtained when measured in a state in which the electronic component is mounted on a standard measurement jig. The method of correcting measurement errors includes a first step of measuring the electrical characteristics in a state in which at least three first correction data obtaining samples having different electrical characteristics from each other are mounted on the standard measurement jig, a second step of measuring electrical characteristics in a state in which (a) the at least three first correction data obtaining samples, (b) at least three second correction data obtaining samples assumed to have electrical characteristics equivalent to those of the at least three first correction data obtaining samples, or (c) at least one third correction data obtaining sample assumed to have electrical characteristics equivalent to those of a portion of the at least three first correction data obtaining samples and the other ones of the first correction data obtaining samples are mounted on the test measurement jig, a third step of determining an equation that correlates, on one and the same electronic component, measurement values of electrical characteristics measured in a state in which the electronic component is mounted on the test measurement jig with measurement values of electrical characteristics measured in a state in which the electronic component is mounted on the standard measurement jig, from a result of measurements in the first and second steps, where the equation assumes presence of leakage signals that are directly transmitted between at least two ports of at least one of the standard measurement jig and the test measurement jig without being transmitted to the electronic component connected to the two ports, a fourth step of measuring electrical characteristics in a state in which an arbitrary electronic component is mounted on the test measurement jig, and a fifth step of calculating electrical characteristics that would be obtained when measured in a state in which the electronic component is mounted on the standard measurement jig, from a result of measurement in the fourth step using the equation determined in the third step.

According to the method described above, the electrical characteristics are estimated using the equation that assumes the leakage signals between the ports. Therefore, when a relative correction is made by using a test measurement jig and a standard measurement jig in which leakage signals are present between the ports, the correction precision of the measurement errors will be improved as compared to a case in which the electrical characteristics are estimated using an equation that does not assume leakage signals between the ports.

Here, in the first, second, and fourth steps, because it will be sufficient if the measurement system connected to the test measurement jig or the standard measurement jig for measuring the electrical characteristics can be regarded as having identical characteristics, a physically different measurement system, for example, a different measuring device or a connection cable may be used.

Preferably, when all of the ports at which the leakage signals are present are corrected in each of the base measurement jig and the test measurement jig, electrical characteristics are measured in a state in which at least five of the first correction data obtaining samples having different electrical characteristics with each other are mounted on the standard measurement jig in the first step. In the second step, electrical characteristics are measured in a state in which the at least five first correction data obtaining samples, at least five second correction data obtaining samples assumed to have electrical characteristics equivalent to those of the at least five first correction data obtaining samples, or at least one of the third correction data obtaining samples assumed to have electrical characteristics equivalent to those of a portion of the at least five first correction data obtaining samples and the other ones of the first correction data obtaining samples are mounted on the test measurement jig. In the third step, the equation determined from the result of measurements in the first and second steps is an equation that assumes correction of the leakage signals of all of the ports in each of the standard measurement jig and the test measurement jig.

In other words, if all of the ports in which the leakage signals are present in each of the standard measurement jig and the test measurement jig are corrected, it is necessary to prepare an equation that assumes correction of the leakage signals of all of the ports. For example, when the leakage is present only between the ports 1 and 2 in an electronic component having three ports, it is sufficient to use three correction data obtaining samples. When the leakage is present between the ports 1 and 2 and between the ports 1 and 3, there is a leakage also between the ports 2 and 3, so that it is necessary to prepare an equation that also assumes correction of the leakage between the ports 2 and 3. In that case, five correction data obtaining samples will be needed.

Preferably, the equation determined in the third step is, in a relative error correction circuit network model in which identical ports are connected with each other and different ports assuming the presence of leakage signals are connected, between an S parameter at the standard measurement jig and an S parameter at the test measurement jig in measurement of arbitrary n ports, a T parameter $T_{CA}'$ of the relative error correction circuit network model normalized by an arbitrary one element in a T parameter $T_{CA}$ of the circuit network model that is calculated by normalizing $T_{CA}$ with the arbitrary one element in $T_{CA}$ on the following equation:

$$\begin{bmatrix} (S_{T1}^t \ I_{n\times n}) \otimes (-I_{n\times n} \ S_{D1}) \\ (S_{T2}^t \ I_{n\times n}) \otimes (-I_{n\times n} \ S_{D2}) \\ \vdots \\ (S_{Tm}^t \ I_{n\times n}) \otimes (-I_{n\times n} \ S_{Dm}) \end{bmatrix} \cdot t_{CA} = 0 \qquad \text{Equation 1}$$

$$t_{CA} = cs[T_{CA}] = \begin{pmatrix} t_{CA11} \\ t_{CA21} \\ \vdots \end{pmatrix}$$

where $\otimes$ is a Kronecker product, cs[ ] is a column expansion, the suffix t represents a transpose matrix, and $I_{n\times n}$ is an n×n unit matrix, that is represented by using: (a) an S parameter $S_{Dm}$ of the m-th correction data obtaining sample measurement values in the standard measurement jig, (b) an S parameter $S_{Tm}$ of the m-th correction data obtaining sample measurement values in the test measurement jig, and (c) the T parameter $T_{CA}$ of the relative error correction circuit network model.

The precision of correcting measurement errors will be improved by using a relative error correction circuit network in which connection is established between different ports at which the presence of leakage signals is assumed.

The calculation is made by replacing the above Equation 1 with $S_D$ measured in the first step and $S_T$ measured in the second step on the correction data obtaining samples that are identical or can be regarded as being identical and by treating $T_{CA}'$ as an unknown number.

When $T_{CA}'$ of the relative correction circuit network model is determined, the S parameter in the standard measurement jig can be calculated in the fifth step from the S parameter in the test measurement jig measured in the fourth step.

Preferably, the equation by which the electrical characteristics are calculated in the fifth step is, in a circuit network model in which identical ports are connected with each other and different ports assuming presence of leakage signals are connected, between an S parameter at the standard measurement jig and an S parameter at the test measurement jig in measurement of arbitrary n ports, $S_D$ calculated based on the following equation:

$$S_D = (T_{CA11}' \cdot S_T + T_{CA12}') \cdot (T_{CA21}' \cdot S_T + T_{CA22}')^{-1} \qquad \text{Equation 2}$$

that is represented by using: (a) an S parameter $S_D$ that would be obtained when measured in a state in which the electronic component is mounted on the standard measurement jig, (b) an S parameter $S_T$ of the electronic component measurement values in the test measurement jig, and (c) square matrices $T_{CA11}'$, $T_{CA12}'$, $T_{CA21}'$, and $T_{CA22}'$ obtained by splitting the T parameter $T_{CA}'$ of the relative error correction circuit network model normalized with arbitrary one element in $T_{CA}$ of the relative error correction circuit network model calculated in the third step into n×n.

In this case, by normalizing $T_{CA}$ with an arbitrary element in $T_{CA}$, $T_{CA}'$ can be determined with good precision from the Equation 1 and, as a result thereof, the S parameter in the standard measurement jig can be calculated from the S parameter in the test measurement jig by using the Equation 2.

Moreover, another preferred embodiment of the present invention provides an electronic component characteristics measuring device that calculates, from a result of measuring electrical characteristics in a state in which an electronic component having arbitrary n ports of two or more ports is mounted on a test measurement jig, the electrical characteristics that would be obtained when measured in a state in which the electronic component is mounted on a standard measurement jig. The electronic component characteristics measuring device includes an equation storing unit arranged to store an equation determined from a first measurement result obtained by measuring electrical characteristics in a state in which at least three first correction data obtaining samples having different electrical characteristics from each other are mounted on the standard measurement jig and a second measurement result obtained by measuring electrical characteristics in a state in which the at least three first correction data obtaining samples, at least three second correction data obtaining samples assumed to have electrical characteristics equivalent to those of the at least three first correction data obtaining samples, or at least one third correction data obtaining sample assumed to have electrical characteristics equivalent to those of a portion of the at least three first correction data obtaining samples and the other ones of the first correction data obtaining samples are mounted on the test measurement jig, at which the equation correlates, on one electronic component, measurement values of electrical characteristics measured in a state in which the electronic component is mounted on the test measurement jig with measurement values of electrical characteristics measured in a state in which the electronic component is mounted on the standard measurement jig, assuming the presence of leakage signals that are directly transmitted between at least two ports of at least one of the standard measurement jig and the test measurement jig without being transmitted to the electronic component connected to the two ports, and an electrical characteristics estimating unit arranged to calculate, from a result of measuring electrical characteristics in a state in which an arbitrary electronic component is mounted on the test measurement jig, the electrical characteristics that would be obtained when measured in a state in which the electronic component is mounted on the standard measurement jig, by using the equation stored in the equation storing unit.

In this case, by using the equation stored in the equation storage unit, an estimated value of the electrical characteristics in a state of being mounted on the standard measurement jig can be calculated.

Here, the electronic component characteristics measuring device may preferably include a measurement unit arranged to measure the characteristics of the electronic component via the standard measurement jig or the test measurement jig or may include an equation calculation unit arranged to determine an equation stored in the measurement equation storage unit using all of or a portion of the results obtained from measurement by the measurement unit.

Preferably, when all of the ports at which the leakage signals are present are corrected in each of the base measurement jig and the test measurement jig, the equation stored by the equation storing unit is determined from the first measurement result obtained by measuring electrical characteristics in a state in which at least five of the first correction data obtaining samples having different electrical characteristics with each other are mounted on the standard measurement jig, and the second measurement result obtained by measuring electrical characteristics in a state in which the at least five first correction data obtaining samples, at least five second correction data obtaining samples assumed to have electrical characteristics equivalent to those of the at least five first correction data obtaining samples, or at least one of the third correction data obtaining samples assumed to have electrical characteristics equivalent to those of a portion of the at least five first correction data obtaining samples and the other ones of the first correction data obtaining samples are mounted on the test measurement jig, assuming correction of the leakage signals of all of the ports in each of the standard measurement jig and the test measurement jig.

Preferably, the equation stored by the equation storing unit is, in a relative error correction circuit network model in which identical ports are connected to each other and different ports assuming the presence of leakage signals are connected, between an S parameter at the standard measurement jig and an S parameter at the test measurement jig in measurement of arbitrary n ports, a T parameter $T_{CA}'$ of the relative error correction circuit network model normalized by arbitrary one element in a T parameter $T_{CA}$ of the circuit network model that is calculated by normalizing $T_{CA}$ with the arbitrary one element in $T_{CA}$ on the following equation:

$$\begin{bmatrix} (S_{T1}^t \ I_{n\times n}) \otimes (-I_{n\times n} \ S_{D1}) \\ (S_{T2}^t \ I_{n\times n}) \otimes (-I_{n\times n} \ S_{D2}) \\ \vdots \\ (S_{Tm}^t \ I_{n\times n}) \otimes (-I_{n\times n} \ S_{Dm}) \end{bmatrix} \cdot t_{CA} = 0 \quad \text{Equation 1}$$

$$t_{CA} = cs[T_{CA}] = \begin{pmatrix} t_{CA11} \\ t_{CA21} \\ \vdots \end{pmatrix}$$

where $\otimes$ is a Kronecker product, $cs[\ ]$ is a column expansion, the suffix t represents a transpose matrix, and $I_{n\times n}$ is an n×n unit matrix, that is represented by using: (a) an S parameter $S_{Dm}$ of the m-th correction data obtaining sample measurement values in the standard measurement jig, (b) an S parameter $S_{Tm}$ of the m-th correction data obtaining sample measurement values in the test measurement jig, and (c) the T parameter $T_{CA}$ of the relative error correction circuit network model.

Preferably, the equation stored in the equation storing unit and used when the electrical characteristics estimating unit calculates, from a result of measuring electrical characteristics in a state in which an arbitrary electronic component is mounted on the test measurement jig, electrical characteristics that would be obtained when measured in a state in which the electronic component is mounted on the standard measurement jig is, in a circuit network model in which identical ports are connected with each other and different ports assuming the presence of leakage signals are connected, between an S parameter at the standard measurement jig and an S parameter at the test measurement jig in measurement of arbitrary n ports, $S_D$ calculated based on the following equation:

$$S_D = (T_{CA11}' \cdot S_T + T_{CA12}') \cdot (T_{CA21}' \cdot S_T + T_{CA22}')^{-1} \qquad \text{Equation 2}$$

that is represented by using: (a) an S parameter $S_D$ that would be obtained when measured in a state in which the electronic component is mounted on the standard measurement jig, (b) an S parameter $S_T$ of the electronic component measurement values in the test measurement jig, and (c) square matrices $T_{CA11}'$, $T_{CA12}'$, $T_{CA21}'$, and $T_{CA22}'$ obtained by splitting the T parameter $T_{CA}'$ of the relative error correction circuit network model normalized with arbitrary one element in $T_{CA}$ of the relative error correction circuit network model calculated from the first measurement result and the second measurement result into n×n.

According to various preferred embodiments of the present invention, the correction precision can be improved by eliminating the correction errors caused by leakage signal components between the ports of the measurement jigs. This improves the yield ratio of the electronic components and ensures highly precise characteristics. Also, even if the leakage signal components increase as a result of a reduction in the size of electronic components, the reduction in size of the electronic components can be easily dealt with by improving the correction precision. Further, there is no need to design and manufacture the measurement jigs by paying particular consideration to the leakage signals, whereby cost reduction can be achieved.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A to 5E are descriptive views of a correction data obtaining sample.

FIG. 6A is a graph showing a relative correction result according to a preferred embodiment of the present invention.

FIG. 6B is a graph showing a relative correction result according to a conventional example.

FIGS. 9A to 9C are 2-terminal pair circuit diagrams showing a basic principle of the relative correction method according to a conventional example.

FIGS. 11A and 11B are descriptive views of a leakage signal.

DETAILED DESCRIPTION OF THE PREFERRED EMBODIMENTS

Hereinafter, preferred embodiments of the present invention will be described with reference to FIGS. 1 to 11B.

Figure 8:
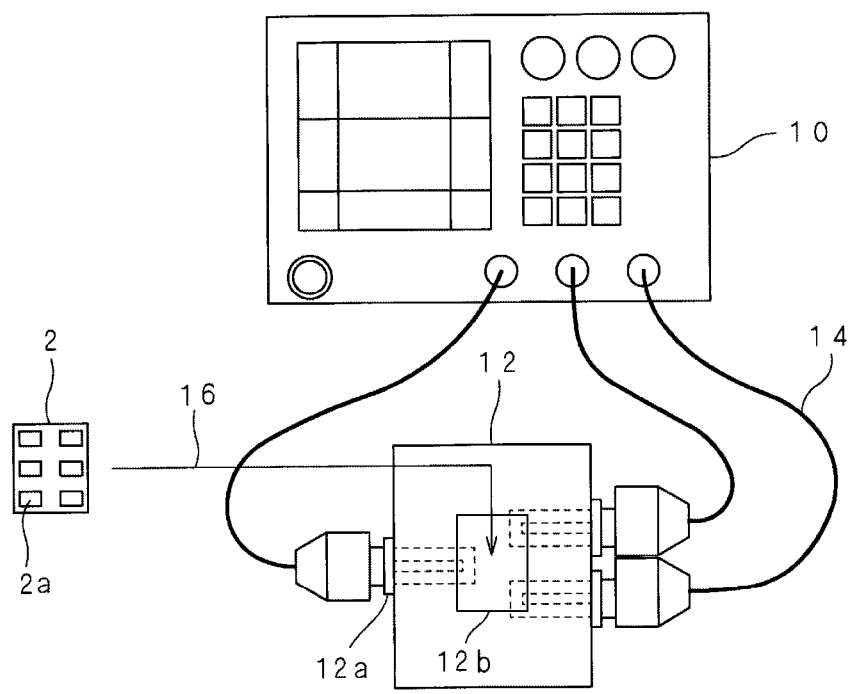
FIG. 8 is a descriptive view of a measurement system according to a preferred embodiment of the present invention.

Referring to FIG. 8, electrical characteristics of an electronic component 2 (for example, a surface acoustic wave filter which is a high-frequency passive electronic component) are measured using a measuring device 10 (for example, a network analyzer) in a state in which the electronic component 2 is mounted on a measurement jig 12. Connection is established between a coaxial connector 12a of the measurement jig 12 and the measuring device 10 by a coaxial cable 14. As shown by an arrow 16, when the electronic component 2 is mounted on a mounting portion 12b of the measurement jig 12, a terminal 2a of the electronic component 2 is electrically connected to the measuring device 10. The measuring device 10 measures the electrical characteristics of the terminal 2a of the electronic component 2 by inputting a signal to a certain terminal and detecting an output signal from another terminal.

In accordance with a predetermined program, the measuring device 10 performs an operation process of measurement data so as to calculate the electrical characteristics of the electronic component 2. In this case, the measuring device 10 reads needed data, such as the measurement values and parameters, used for operation from an internal memory or recording medium or reads needed data by communicating with an external apparatus (for example, a server). The measuring device 10 can be split into a plurality of apparatuses. For example, the measuring device 10 may be split into a measurement portion that performs measurement only and an operation portion that receives input of measurement data and performs an operation process or a determination of good or bad products.

Here, it is sufficient that the measuring device 10 can store data of equations for performing a relative correction described below in an equation storage unit, such as a memory, for example, and can calculate an estimated value of the electrical characteristics by relative correction using the data about an arbitrary electronic component with an electrical characteristics estimation unit, such as a CPU, for example. In other words, the measuring device 10 may determine an equation to perform the relative correction by performing measurements and operations by itself, one that determines an equation to perform the relative correction using data that are measured in another measuring device, or furthermore, one that stores data about equations to perform the relative corrections that are determined in another measuring device and calculate an estimated value of the electrical characteristics by relative correction on an arbitrary electronic component by using the data.

It is difficult to fabricate a plurality of measurement jigs 12 having identical characteristics. For this reason, even with an identical electronic component 2, there will be variations in the characteristics for each measurement jig, if the measurement jig 12 used to measure differs, whereby the measurement results will also differ. For example, the measurement results will differ between a measurement jig (standard measurement jig) used to ensure the electrical characteristics to users and a measurement jig (test measurement jig) used in measurement to select good products in the step of manufacturing the electronic component. Such a difference in the measurement values between the measurement jigs can be corrected by the relative correction method.

Next, a basic principle of a relative correction method of a conventional example will be described with reference to FIGS. 9A to 10B. In the following, for the sake of simplification, a description will be given of a 2-terminal pair circuit, as an example, on the electrical characteristics between two ports. However, this can be extended also to an n-terminal pair circuit (n is an integer of 1, 3, or more than 3).

FIG. 9A shows a 2-terminal pair circuit of a standard measurement jig on which an electronic component having two ports (hereinafter, referred to as "sample DUT") is mounted. The characteristics of the sample DUT are represented by a scattering matrix ($S_{DUT}$). The error characteristics between the coaxial connector and the port of the sample DUT in the standard measurement jig are represented by scattering matrices ($E_{D1}$), ($E_{D2}$). At the terminals on both sides of the circuit, measurement values in a state in which the sample DUT is mounted on the standard measurement jig (hereinafter, also referred to as "standard measurement jig measurement values") $S_{11D}$, $S_{21D}$ are obtained.

FIG. 9B shows a 2-terminal pair circuit of a test measurement jig on which a sample DUT is mounted. The characteristics of the sample DUT are represented by a scattering matrix ($S_{DUT}$). The error characteristics between the coaxial connector and the port of the sample DUT in the test measurement jig are represented by scattering matrices ($E_{T1}$), ($E_{T2}$). At the terminals on both sides of the circuit, measurement values in a state in which the sample DUT is mounted on the test measurement jig (hereinafter, also referred to as "test measurement jig measurement values") $S_{11T}$, $S_{21T}$ are obtained.

FIG. 9C shows a state in which adaptors $(E_{T1})^{-1}$, $(E_{T2})^{-1}$ that neutralize the error characteristics ($E_{T1}$), ($E_{T2}$) are connected to both sides of the circuit of FIG. 9B. Theoretically, these adaptors $(E_{T1})^{-1}$, $(E_{T2})^{-1}$ are obtained by converting the scattering matrices ($E_{T1}$), ($E_{T2}$) of the error characteristics into transmission matrices, determining the inverse matrices thereof, and converting them again into the scattering matrices. At the boundary portions 80, 82 between the error characteristics ($E_{T1}$), ($E_{T2}$) and the adaptors $(E_{T1})^{-1}$, $(E_{T2})^{-1}$, test measurement jig measurement values $S_{11T}$, $S_{21T}$ are obtained that are measured by mounting the sample DUT on the test measurement jig. At the terminals on both sides of the circuit of FIG. 9C, the errors of the test measurement jig are removed, and the measurement values $S_{11DUT}$, $S_{21DUT}$ of the sample DUT itself are obtained.

Figures 10A, 10B:
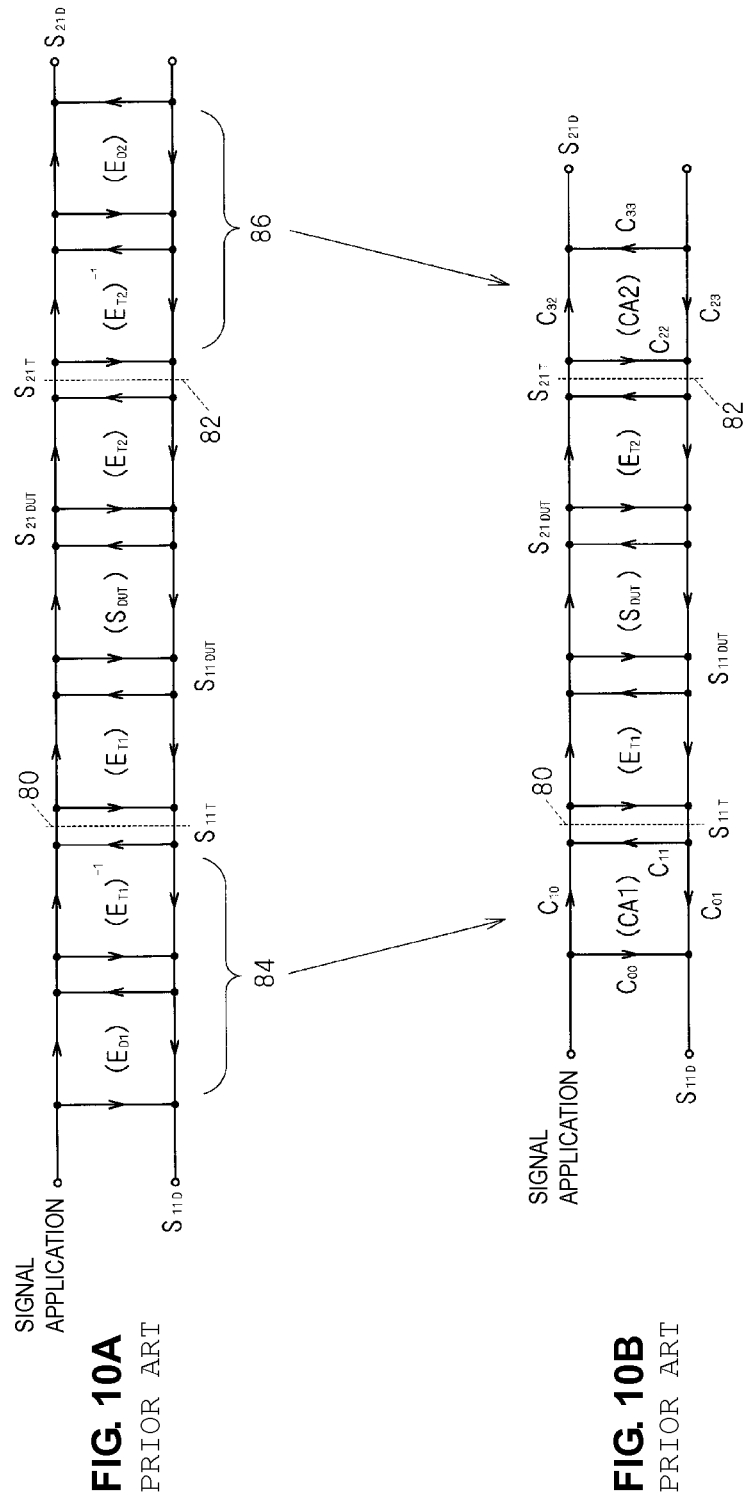
FIGS. 10A and 10B are a 2-terminal pair circuit diagrams showing a basic principle of the relative correction method according to a conventional example.

Since the circuit of FIG. 9C is equivalent to the sample DUT alone, a state such as that shown in FIG. 10A will appear when the scattering matrices ($E_{D1}$), ($E_{D2}$) of the error characteristics of the standard measurement jig are connected to both sides in the same manner as in FIG. 9A Assuming that the scattering matrix obtained by synthesizing ($E_{D1}$), $(E_{T1})^{-1}$ shown by a reference symbol 84 in FIG. 10A is (CA1) and that the scattering matrix obtained by synthesizing $(E_{T2})^{-1}$, ($E_{D2}$) shown by a reference symbol 86 is (CA2), a state such as that shown in FIG. 10B will appear. These scattering matrices (CA1), (CA2) are known as "relative correction adaptors", and correlate the test measurement jig measurement values $S_{11T}$, $S_{21T}$ to the standard measurement jig measurement values $S_{11D}$, $S_{21D}$. Therefore, when the relative correction adaptors (CA1), (CA2) are determined, the standard measurement jig measurement values $S_{11D}$, $S_{21D}$ can be calculated (estimated) using the relative correction adaptors (CA1), (CA2) from the test measurement jig measurement values $S_{11T}$, $S_{21T}$ in a state in which an arbitrary electronic component is mounted on the test measurement jig.

Each of the relative correction adaptors (CA1), (CA2) includes four coefficients $c_{00}$, $c_{01}$, $c_{10}$, $c_{11}$; $c_{22}$, $c_{23}$, $c_{32}$, $c_{33}$. However, the reciprocity theorem makes $c_{01}=c_{10}$, $c_{23}=c_{32}$. Therefore, the coefficients $c_{00}$, $c_{01}$, $c_{10}$, $c_{11}$; $c_{22}$, $c_{23}$, $c_{32}$, $c_{33}$ can be determined by using measurement values measured by mounting three kinds of 1-port standard samples (correction data obtaining samples) having different characteristics on the standard measurement jig and the standard measurement jig between respective ports.

The basic characteristics of the correction data obtaining samples for calculating the relative correction adaptors must be such that the transmission coefficient between respective ports is sufficiently small and that the reflection coefficient characteristics at the same port and at the same frequency differ respectively between the correction data obtaining samples. Since it is a reflection coefficient, forming an Open, a Short-circuit, and an End terminal facilitates producing the basic characteristics of the above-described correction data obtaining samples. Also, the outer form of the correction data obtaining samples is preferably an outer form that can be mounted on the measurement jigs in the same or similar manner as the correction object samples.

The Open, the Short-circuit, and the End terminal between respective ports can be achieved by connecting the signal line of a package to the ground with a lead wire, a chip resistor, or other suitable circuit element in the inside of the package that is identical to the sample that defines an object of measurement. However, with this method, when the size of the sample that defines an object of measurement is reduced, it becomes difficult to arrange members, such as the chip resistor, for example, in the inside of the package, whereby the correction data obtaining samples cannot be fabricated, and as a result thereof, a problem arises in that the selection of good products cannot be performed using the relative correction method.

As a countermeasure against this, the correction data obtaining samples are fabricated using the step of producing the sample (electronic component) that defines an object of measurement. In this case, the correction data obtaining samples may be fabricated using any of the production line for producing electronic components for commercial products, the production line for experimentally producing test samples of electronic components, and a situation in which the two are combined.

Moreover, it is sufficient that the correction data obtaining samples mounted on the standard measurement jig and the correction data obtaining samples mounted on the test measurement jig have the same or substantially the same electrical characteristics in principle, the samples may not be the same. For example, the relative correction adaptors can be determined by preparing a plurality of correction data obtaining samples that can be regarded as having the same electrical characteristics and mounting separate correction data obtaining samples arbitrarily selected from the prepared correction data obtaining samples respectively on the standard measurement jig and the test measurement jig for making measurements.

As shown by an arrow 8a in the descriptive view of FIG. 11A, leakage signal components that are directly transmitted between the signal paths 4a, 5a of the ports 1, 2 of the measurement jig 12a and are not transmitted between the ports 1, 2 of the electronic component 2s mounted on the measurement jig 12a are present. Also, as shown by an arrow 8b in the descriptive view of FIG. 11B, the leakage signal components that are directly transmitted between the ports 2, 3 of the measurement jig 12b will be relatively large. The conventional relative correction methods are based on a circuit network model that does not consider such leakage signals in the measurement jigs. For this reason, with the conventional relative correction methods, the correction errors caused by the leakage signals remain.

Next, the basic principle of preferred embodiments of the present invention will be described with reference to FIGS. 1 to 3.

Figure 1:
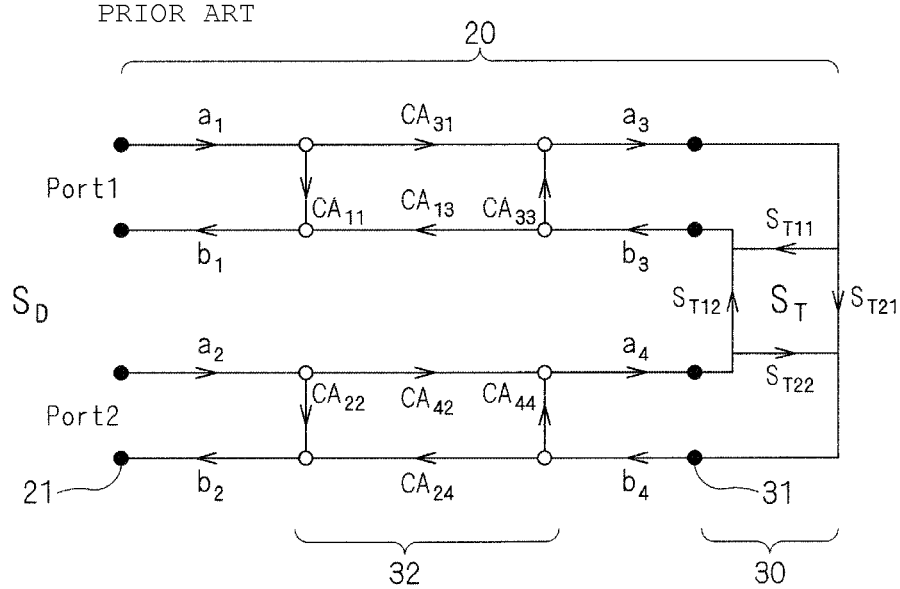
FIG. 1 is a signal flow diagram of a 2-port measurement system according to a conventional example.

FIG. 1 is a signal flow diagram obtained by re-drawing a 2-terminal pair circuit used in the relative correction method of a conventional example for the sake of comparison. The reference symbol 20 denotes a portion corresponding to the standard measurement jig, and the reference symbol 21 denotes a terminal corresponding to the coaxial connector of the standard measurement jig. The reference symbol 30 denotes a portion corresponding to the test measurement jig, and the reference symbol 31 denotes a terminal corresponding to the coaxial connector of the test measurement jig. The relative correction adaptors 32 are connected independently from each other for each of the ports 1, 2 between the terminal 21 of the standard measurement jig 20 and the terminal 31 of the test measurement jig 30.

Figure 2:
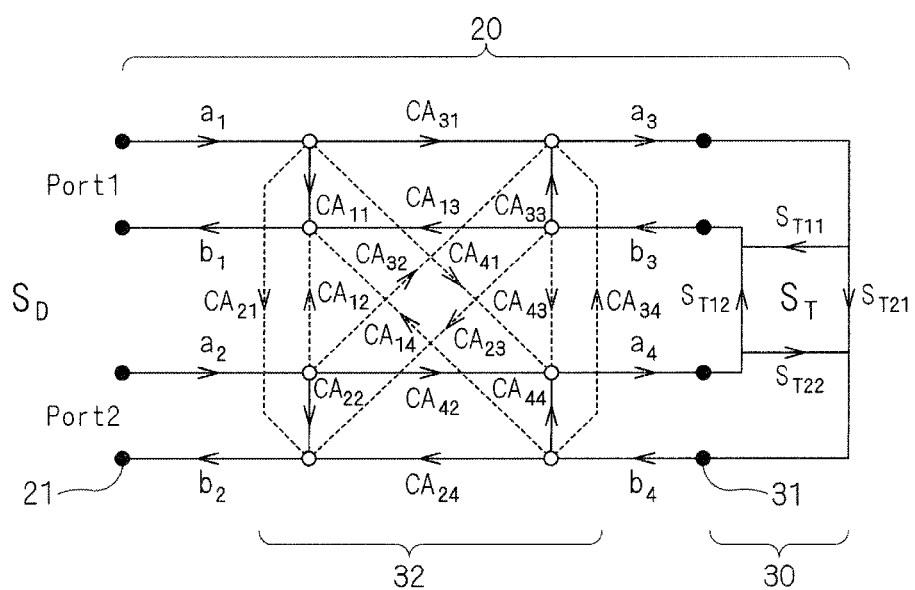
FIG. 2 is a signal flow diagram of a 2-port measurement system according to a preferred embodiment of the present invention.

In contrast, in the relative correction method of a preferred embodiment of the present invention, a signal flow diagram shown in FIG. 2 is used. Specifically, for the relative correction adaptors 32 connected between the terminal 21 of the standard measurement jig 20 and the terminal 31 of the test measurement jig 30 for the ports 1, 2, portions shown by broken lines are added to the same portions as those of the conventional examples shown by solid lines. By these broken-line portions, the presence of leakage signals that are directly transmitted between the ports, that is, leakage signals that are not transmitted to the electronic component connected to the ports, can be assumed between the ports of at least one of the standard measurement jig and the test measurement jig.

In greater detail, $CA_{12}$ is connected between the input signal ($a_2$) to the port 2 of the standard measurement jig and the output signal ($b_1$) from the port 1 of the standard measurement jig. $CA_{21}$ is connected between the input signal ($a_1$) to the port 1 of the standard measurement jig and the output signal ($b_2$) from the port 2 of the standard measurement jig.

$CA_{34}$ is connected between the output signal ($b_4$) from the port 2 of the test measurement jig and the input signal ($a_3$) to the port 1 of the test measurement jig. $CA_{43}$ is connected between the output signal ($b_3$) from the port 1 of the test measurement jig and the input signal ($a_4$) to the port 2 of the test measurement jig.

$CA_{14}$ is connected between the output signal ($b_4$) from the port 2 of the test measurement jig and the output signal ($b_1$) from the port 1 of the standard measurement jig. $CA_{41}$ is connected between the input signal ($a_1$) to the port 1 of the standard measurement jig and the input signal ($a_4$) to the port 2 of the test measurement jig.

$CA_{23}$ is connected between the output signal ($b_3$) from the port 1 of the test measurement jig and the input signal ($b_2$) from the port 2 of the standard measurement jig. $CA_{32}$ is connected between the input signal ($a_2$) to the port 2 of the standard measurement jig and the input signal ($a_3$) to the port 1 of the test measurement jig.

From FIG. 2, the following three equations are maintained.

$$\begin{pmatrix} b_1 \\ b_2 \\ a_1 \\ a_2 \end{pmatrix} = \begin{pmatrix} t_{CA11} & t_{CA12} & t_{CA13} & t_{CA14} \\ t_{CA21} & t_{CA22} & t_{CA23} & t_{CA24} \\ t_{CA31} & t_{CA32} & t_{CA33} & t_{CA34} \\ t_{CA41} & t_{CA42} & t_{CA43} & t_{CA44} \end{pmatrix} \cdot \begin{pmatrix} b_3 \\ b_4 \\ a_3 \\ a_4 \end{pmatrix} \quad \text{Equation 3}$$

$$\begin{pmatrix} b_3 \\ b_4 \end{pmatrix} = S_T \cdot \begin{pmatrix} a_3 \\ a_4 \end{pmatrix} \quad \text{Equation 4}$$

$$\begin{pmatrix} b_1 \\ b_2 \end{pmatrix} = S_D \cdot \begin{pmatrix} a_1 \\ a_2 \end{pmatrix} \quad \text{Equation 5}$$

Here, the smaller matrices of square matrices obtained by splitting the T parameter $T_{CA}$ $$T_{CA} = \begin{pmatrix} t_{CA11} & t_{CA12} & t_{CA13} & t_{CA14} \\ t_{CA21} & t_{CA22} & t_{CA23} & t_{CA24} \\ t_{CA31} & t_{CA32} & t_{CA33} & t_{CA34} \\ t_{CA41} & t_{CA42} & t_{CA43} & t_{CA44} \end{pmatrix} \quad \text{Equation 6}$$

which is a relative correction adaptor 32 into 2×2 are assumed to be $T_{CA11}$, $T_{CA12}$, $T_{CA21}$, and $T_{CA22}$. Specifically, it is set that $$T_{CA11} = \begin{pmatrix} t_{CA11} & t_{CA12} \\ t_{CA21} & t_{CA22} \end{pmatrix} \quad \text{Equation 7}$$

$$T_{CA12} = \begin{pmatrix} t_{CA13} & t_{CA14} \\ t_{CA23} & t_{CA24} \end{pmatrix}$$

$$T_{CA21} = \begin{pmatrix} t_{CA31} & t_{CA32} \\ t_{CA41} & t_{CA42} \end{pmatrix}$$

$$T_{CA22} = \begin{pmatrix} t_{CA33} & t_{CA34} \\ t_{CA43} & t_{CA44} \end{pmatrix}$$

The Equation 3 is represented as follows by using the Equation 7.

$$\begin{pmatrix} b_1 \\ b_2 \end{pmatrix} = T_{CA11} \cdot \begin{pmatrix} b_3 \\ b_4 \end{pmatrix} + T_{CA12} \cdot \begin{pmatrix} a_3 \\ a_4 \end{pmatrix} \quad \text{Equation 8a}$$

$$\begin{pmatrix} a_1 \\ a_2 \end{pmatrix} = T_{CA21} \cdot \begin{pmatrix} b_3 \\ b_4 \end{pmatrix} + T_{CA22} \cdot \begin{pmatrix} a_3 \\ a_4 \end{pmatrix} \quad \text{Equation 8b}$$

By replacing the Equation 8a with the Equation 5 and further replacing with the Equation 8b, the following equation is obtained.

$$T_{CA11} \cdot \begin{pmatrix} b_3 \\ b_4 \end{pmatrix} + T_{CA12} \cdot \begin{pmatrix} a_3 \\ a_4 \end{pmatrix} = S_D \cdot \left[ T_{CA21} \cdot \begin{pmatrix} b_3 \\ b_4 \end{pmatrix} + T_{CA22} \cdot \begin{pmatrix} a_3 \\ a_4 \end{pmatrix} \right] \quad \text{Equation 9}$$

By replacing the Equation 9 with the Equation 4, the following equation is obtained.

$$T_{CA11} \cdot S_T + T_{CA12} = S_D \cdot (T_{CA21} \cdot S_T + T_{CA22}) \quad \text{Equation 10}$$

By multiplying the Equation 10] by $(T_{CA21} \cdot S_T + T_{CA22})^{-1}$ from the right, the following is obtained.

$$S_D = (T_{CA11} \cdot S_T + T_{CA12}) \cdot (T_{CA21} \cdot S_T + T_{CA22})^{-1} \quad \text{Equation 11}$$

whereby the Equation 11 is determined.

When this Equation 11 is transformed into a linear combination to $T_{CA}$, the following is obtained.

$$[(S_T^t \; I_2) \otimes (-I_2 \; S_D)] \cdot t_{CA} = A_{4 \times 16} \cdot t_{CA} = 0 \quad \text{Equation 12}$$

$$t_{CA} = cs[T_{CA}] = \begin{pmatrix} t_{CA11} \\ t_{CA21} \\ \vdots \\ t_{CA44} \end{pmatrix} \quad \text{Equation 13}$$

Here, the Equation 14a
⊗ is a Kronecker product.
The Equation 14b
cs[ ] is a column expansion.
The suffix t is a transpose matrix.
$I_2$ is a 2×2 unit matrix. Hereinafter, $I_n$ is defined as an n×n unit matrix.

When $t_{CA}$ is normalized by one element, for example, $-t_{CA11}$, the Equation 12 will be $$\frac{1}{-t_{CA11}} \cdot A_{4\times16} \cdot t_{CA} = A_{4\times16} \cdot \begin{pmatrix} -1 \\ t'_{CA} \end{pmatrix} \quad \text{Equation 15}$$

$$= (u_{4\times1} \; B_{4\times15}) \cdot \begin{pmatrix} -1 \\ t'_{CA} \end{pmatrix}$$

$$= -u_{4\times1} + B_{4\times15} \cdot t'_{CA} = 0$$

Here, $A_{4\times16}$ is a 4×16 matrix; $u_{4\times1}$ is a 4×1 matrix, and $B_{4\times15}$ is a 4×15 matrix.
Therefore, the following holds.

$$B_{4\times15} \cdot t'_{CA} = u_{4\times1} \quad \text{Equation 16}$$

$$t'_{CA} = \begin{pmatrix} -\frac{t_{CA21}}{t_{CA11}} \\ -\frac{t_{CA31}}{t_{CA11}} \\ \vdots \\ -\frac{t_{CA44}}{t_{CA11}} \end{pmatrix} \quad \text{Equation 17}$$

The Equation 16 and Equation 17 show that four linear equations to $t_{CA}'$ are determined by measuring DUT with the standard measurement jig and the test measurement jig.

When it is assumed that the leakage error relative correction adaptor $t_{CA}'$ is unknown, $t_{CA}'$ is determined by using DUT as a correction data obtaining sample and measuring some correction data obtaining samples because the Equation 16 and Equation 17 represent four simultaneous linear equations to $t_{CA}'$. When $N_{std}$ correction data obtaining samples are measured, the Equation 16 and Equation 17 are represented by the following equations.

$$C_{4N_{std}\times15} \cdot t'_{CA} = v_{4N_{std}} \quad \text{Equation 18}$$

$$C_{4N_{std}\times15} = \begin{pmatrix} B_{14\times15} \\ \vdots \\ B_{N_{std}4\times15} \end{pmatrix} \quad \text{Equation 19}$$

$$v_{4N_{std}} = \begin{pmatrix} u_{14} \\ \vdots \\ u_{N_{std}4} \end{pmatrix} \quad \text{Equation 20}$$

Since $C_{4Nstd\times15}$ and $v_{4N}$ are measurement values, errors are present. When it is assumed that the distribution of errors is a normal distribution, $t_{CA}'$ is determined by solving the minimum square problem. In order that rank $[C_{4Nstd\times15}]\geq15$ (the number of unknown numbers of $t_{CA}'$), it is sufficient that five or more correction data obtaining samples having different characteristics are prepared. Depending on the measurement environment, the precision of the solution of $t_{CA}'$ will be improved by considering the difference of the dispersion of measurement values on the Equation 18. Also, when the distribution of errors is not a normal distribution, $t_{CA}'$ is determined by using the maximum-likelihood method.

By replacing the Equation 11 with $t_{CA}'$ determined by the above-described method, the standard measurement jig measurement value can be estimated from the test measurement jig measurement value.

Next, an influence on the relational equation, Equation 11, of the standard measurement jig measurement value and the test measurement jig measurement value obtained by normalizing $T_{CA}$ will be considered.

When $-t_{CA11}$ is set to be α, the Equation 11 is transformed as follows.

$$S_D = (T_{CA11} \cdot S_T + T_{CA12}) \cdot (T_{CA21} \cdot S_T + T_{CA22})^{-1} \quad \text{Equation 21}$$

$$= \begin{pmatrix} \alpha \cdot T'_{CA11} \cdot S_T + \\ \alpha \cdot T'_{CA12} \end{pmatrix} \cdot \begin{pmatrix} \alpha \cdot T'_{CA21} \cdot S_T + \\ \alpha \cdot T'_{CA22} \end{pmatrix}^{-1}$$

$$= \begin{pmatrix} T'_{CA11} \cdot S_T + \\ T'_{CA12} \end{pmatrix} \cdot \begin{pmatrix} T'_{CA21} \cdot S_T + \\ T'_{CA22} \end{pmatrix}^{-1}$$

$$T'_{CA11} = \begin{pmatrix} -1 & -\frac{t_{CA12}}{t_{CA11}} \\ -\frac{t_{CA21}}{t_{CA11}} & -\frac{t_{CA22}}{t_{CA11}} \end{pmatrix} \quad \text{Equation 22}$$

$$T'_{CA12} = \begin{pmatrix} -\frac{t_{CA13}}{t_{CA11}} & -\frac{t_{CA14}}{t_{CA11}} \\ -\frac{t_{CA23}}{t_{CA11}} & -\frac{t_{CA24}}{t_{CA11}} \end{pmatrix}$$

$$T'_{CA21} = \begin{pmatrix} -\frac{t_{CA31}}{t_{CA11}} & -\frac{t_{CA32}}{t_{CA11}} \\ -\frac{t_{CA41}}{t_{CA11}} & -\frac{t_{CA42}}{t_{CA11}} \end{pmatrix}$$

$$T'_{CA22} = \begin{pmatrix} -\frac{t_{CA33}}{t_{CA11}} & -\frac{t_{CA34}}{t_{CA11}} \\ -\frac{t_{CA43}}{t_{CA11}} & -\frac{t_{CA44}}{t_{CA11}} \end{pmatrix}$$

The Equation 21 and Equation 22 show that the standard measurement jig measurement value can be estimated from the test measurement jig measurement value even by using $t_{CA}'$ determined by normalization. Therefore, there is no problem with the normalization.

Here, an example has been described in which $-t_{CA11}$ is used as an element of the T parameter that will be a standard of normalization. Actually, however, it is desirable to select an element that does not assume a value around zero.

Next, an arbitrary N-port measurement system will be described.

First, a 3-port measurement system will be described. FIG. 3 shows a block diagram of the relative correction method in which model leakage signals in the 3-port measurements are shown. The meaning of each reference symbol is the same as in the 2-port example (FIGS. 1 and 2).

Figure 3:
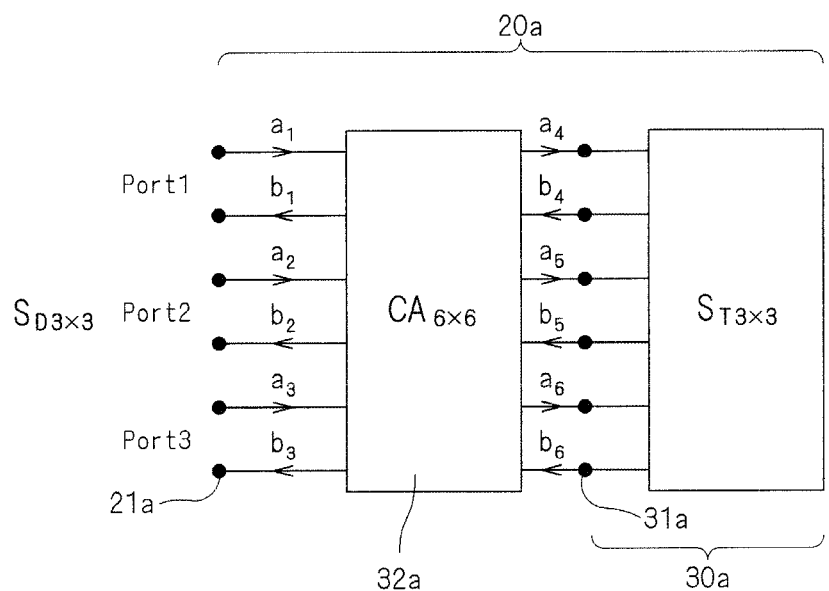
FIG. 3 is a block diagram of a 3-port measurement system according to a preferred embodiment of the present invention.

In FIG. 3, the relationship between $S_T$ and $S_D$ is represented by the following equation when the T parameter $T_{CA}$ of the leakage signal relative correction circuit network is used. This is approximately the same as in the 2-port case, except that each matrix is a 3×3 matrix.

$$S_D = (T_{CA11} \cdot S_T + T_{CA12}) \cdot (T_{CA21} \cdot S_T + T_{CA22})^{-1} \quad \text{Equation 23}$$

$$T_{CA} = \begin{pmatrix} t_{CA11} & t_{CA12} & t_{CA13} & t_{CA14} & t_{CA15} & t_{CA16} \\ t_{CA21} & t_{CA22} & t_{CA23} & t_{CA24} & t_{CA25} & t_{CA26} \\ t_{CA31} & t_{CA32} & t_{CA33} & t_{CA43} & t_{CA35} & t_{CA36} \\ t_{CA41} & t_{CA42} & t_{CA43} & t_{CA44} & t_{CA45} & t_{CA46} \\ t_{CA51} & t_{CA52} & t_{CA53} & t_{CA54} & t_{CA55} & t_{CA56} \\ t_{CA61} & t_{CA62} & t_{CA63} & t_{CA64} & t_{CA65} & t_{CA66} \end{pmatrix} \quad \text{Equation 24}$$

$$T_{CA11} = \begin{pmatrix} t_{CA11} & t_{CA12} & t_{CA13} \\ t_{CA21} & t_{CA22} & t_{CA23} \\ t_{CA31} & t_{CA32} & t_{CA33} \end{pmatrix} \quad \text{Equation 25}$$

$$T_{CA12} = \begin{pmatrix} t_{CA14} & t_{CA15} & t_{CA16} \\ t_{CA24} & t_{CA25} & t_{CA26} \\ t_{CA34} & t_{CA35} & t_{CA36} \end{pmatrix}$$

$$T_{CA21} = \begin{pmatrix} t_{CA41} & t_{CA42} & t_{CA43} \\ t_{CA51} & t_{CA52} & t_{CA53} \\ t_{CA61} & t_{CA62} & t_{CA63} \end{pmatrix}$$

$$T_{CA22} = \begin{pmatrix} t_{CA44} & t_{CA45} & t_{CA46} \\ t_{CA54} & t_{CA55} & t_{CA56} \\ t_{CA64} & t_{CA65} & t_{CA66} \end{pmatrix}$$

The following equation is determined by a procedure similar to the 2-port case.

$$\begin{bmatrix} (S_T{}^t \ I_3) \otimes \\ (-I_3 \ S_D i) \end{bmatrix} \cdot t_{CA} = A_{9 \times 36} \cdot t_{CA} = 0 \quad \text{Equation 26}$$

$$t_{CA} = cs[T_{CA}] = \begin{pmatrix} t_{CA11} \\ t_{CA21} \\ \vdots \\ t_{CA66} \end{pmatrix} \quad \text{Equation 27}$$

The Equation 26 and Equation 27 are the same as the Equation 12 and the Equation 13 of the 2-port case, although the dimensions are different. Therefore, by performing normalization in the same manner, it can be turned into a form of the observation equation in the least square method. Then, $t_{CA}'$ can be determined by measuring five or more correction data obtaining samples having different characteristics with use of the standard measurement jig and the test measurement jig and replacing with the measurement value thereof.

In other words, the solution of the leakage error relative correction adaptors in the 3-port case can be regarded as an extension of the method in the 2-port case.

The same also applies to a case of four or more ports, and the present technique can be extended to an arbitrary N-port case.

In order to perform relative correction of leakage signals between the ports in a 2-port case, two measurement states including the leakage signals between the ports, namely a standard state and a test state, were constructed with a coaxial rail.

Figure 4A:
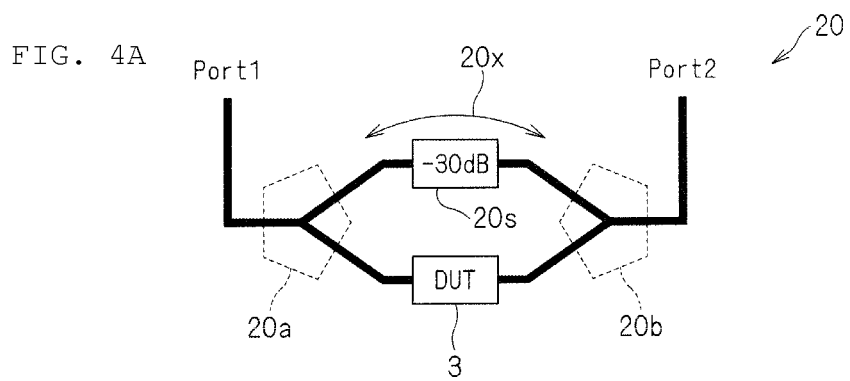
FIGS. 4A and 4B are descriptive views showing a measurement state.
Figure 4B:
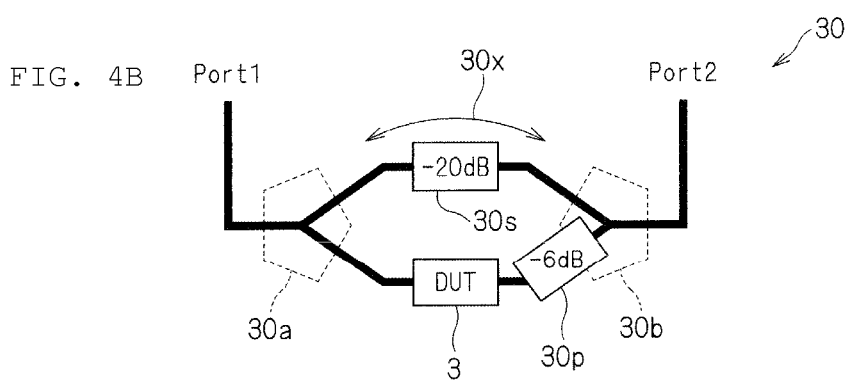

FIGS. 4A and 4B show model views of the measurement system. FIG. 4A is the standard state, and FIG. 4B is the test state. In both states, as shown by arrow 20x, 30x, a path that does not pass through DUT3, namely leakage signals, are generated by distributors 20a, 20b; 30a, 30b. The leakage signal level is adjusted by attenuators 20s, 30s, whereby the standard state was preferably set to be about −37 dB, for example, and the test state was preferably set to be about −27 dB, for example. Also, in the test state, an attenuator 30p of about −6 dB, for example, is further connected to the DUT3 side, whereby the loss is increased relative to the standard state.

FIGS. 5A to 5E show correction data obtaining samples. Five 2-port correction data obtaining samples 2a to 2e were prepared. As to the correction data obtaining samples 2a to 2c of OPEN/OPEN, SHORT/SHORT, LOAD/LOAD shown in FIGS. 5A to 5C, two pieces of a CAL kit (85952B) were simultaneously connected. The correction data obtaining sample 2d of LINE of FIG. 5D is preferably a 3.5 mm male-female connector, for example. As the correction data obtaining sample 2e of −6 dBATT of FIG. 5E, an attenuator manufactured by MKT Taisei is used. The values themselves of the electrical characteristics of the correction data obtaining samples 2a to 2e are unknown, so that only the measurement values in the standard state and the test state in which the samples were mounted on the measurement jigs were used to determine the parameter of the relative correction circuit network.

The other experimental conditions are as follows.
[Measurement device] E8364B (Agilent Technologies)
[Measurement frequency] 500 MHz to 2 GHz
[Middle frequency] 100 Hz
[DUT] −3BATT (MKT Taisei)

By using the determined parameter of the relative correction circuit network, an estimated value of the electrical characteristics in a state in which the samples were mounted on the standard measurement jig was calculated by the relative correction method from the measurement values in a state in which the samples were mounted on the test measurement jig.

Figure 7A:
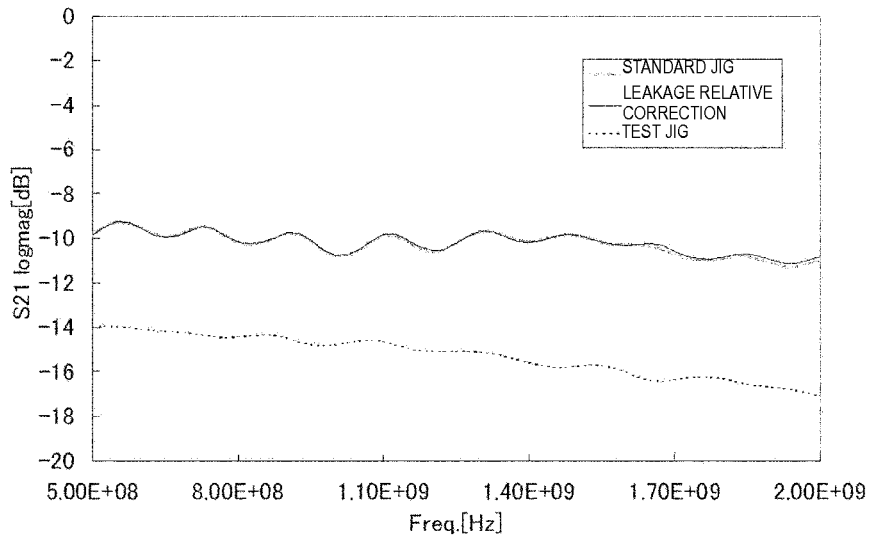
FIG. 7A is a graph showing a relative correction result according to a preferred embodiment of the present invention.
Figure 7B:
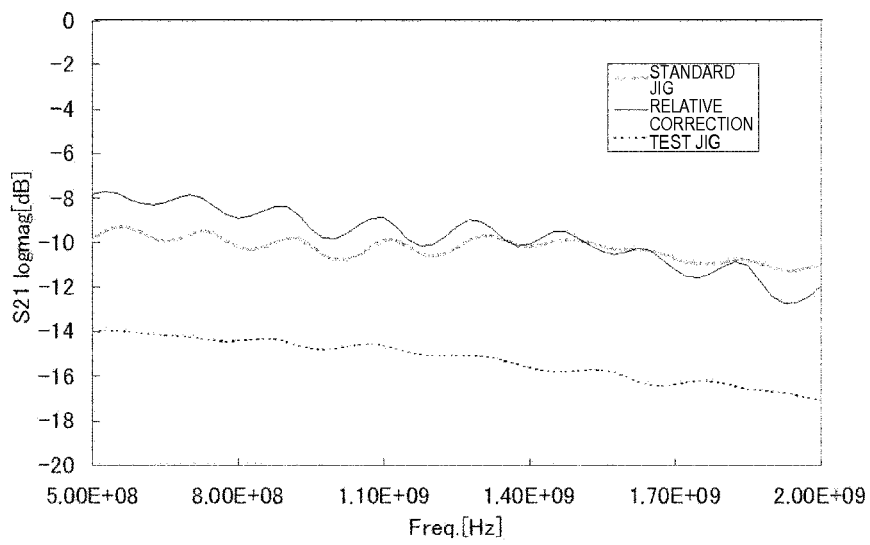
FIG. 7B is a graph showing a relative correction result according to a conventional example.

FIGS. 6A and 7A show a graph of the correction result of $S_{11}$ and $S_{21}$, respectively. For the sake of comparison, FIGS. 6B and 7B show a graph of the correction result of $S_{11}$ and $S_{21}$, respectively, in the case in which relative correction adaptors of the conventional example that do not consider the leakage signals between the ports are used. In FIGS. 6A to 7B "standard jig" represents a measurement value in a state of being mounted on the standard measurement jig; "test jig" represents a measurement value in a state of being mounted on the test measurement jig; "relative correction" represents an estimated value of the electrical characteristics in the state of being mounted on the standard measurement jig that is calculated from the measurement value in the state of being mounted on the test measurement jig by the relative correction method of the conventional example; and "leakage relative correction" represents an estimated value of the electrical characteristics in the state of being mounted on the standard measurement jig that is calculated from the measurement value in the state of being mounted on the test measurement jig by the relative correction method of the present invention.

In the conventional example, it is not possible to make a correction including the leakage signals in a measurement system including the leakage signals, such as in FIG. 4, so that correction errors will remain as shown in FIGS. 6B and 7B. In contrast, referring to FIGS. 6A and 7A, according to a preferred embodiment of the present invention, it will be understood that the correction is made with good precision even in a case including the leakage signals. From this result, preferred embodiments of the present invention improve the actual measurement including the leakage signals.

Here, correction of measurement errors can be made in which the frequency characteristics of $T_{CA}'$ are also considered, by determining $T_{CA}'$ for each frequency within the measurement frequency region. In other words, the characteristics can be ensured at a high precision by determining $T_{CA}'$ at the frequency at which the commercial products are actually used, and making an error correction based on that.

Further, by performing processing as a single circuit network by combining with correction data of a measurement device such as a network analyzer, the correction calculation time can be reduced. Accordingly, the commercial products can be measured at a higher speed at the time of mass production.

When it is known that the leakage signals are present only between two specific ports (for example, between ports 1, 2) and the leakage signals are absent between other ports (for example, between ports 1, 3 or between ports 2, 3) in a 3-port measurement system, the number of unknown numbers will be decreased. Therefore, the relative correction adaptors can be determined from the measurement values of at least three correction data obtaining samples.

Moreover, even when using the standard measurement jig and the test measurement jig in which leakage signals are absent, the relative correction method of preferred embodiments of the present invention can be applied. In this case, the relative correction components will be zero for the leakage signals, so that the correction precision will be the same as or substantially the same as or greater than that of the relative correction method of a conventional example.

Therefore, the relative correction method of preferred embodiments of the present invention can be applied irrespective of the presence or absence of leakage signals in the measurement jigs.

Conventionally, a standard measurement jig measurement value is estimated by determining, for each port, a scattering matrix (relative correction adaptor) obtained by synthesizing a scattering matrix that removes test measurement jig errors and a scattering matrix of standard measurement jig errors and synthesizing the resultant to a scattering matrix of test measurement jig measurement value.

In contrast, for the relative correction adaptor of preferred embodiments of the present invention, a model relative correction adaptor including leakage signal components that are directly transmitted between the ports of the measurement jigs without the intermediary of DUT is used as shown by broken lines in FIG. 2. For this reason, the correction errors caused by leakage signal components are not generated. The relative correction adaptor of preferred embodiments of the present invention is determined by measuring, on the standard measurement jig and the test measurement jig, at least three correction data obtaining samples having the same number of ports as the measurement jigs and having different characteristics from each other, and then performing calculations. Preferred embodiments of the present invention can be extended to an arbitrary N-port measurement of 2 or more ports.

Preferred embodiments of present invention includes leakage signal components that are also generated in the measurement jigs into a correction model, so that correction errors related to the leakage signal components are not generated. Therefore, the correction precision of the relative correction method is improved, whereby the margin for determining good or bad products in the selection step are reduced, thereby improving the yield ratio. Also, as to components having a high performance, there is no need to ensure characteristics at a high precision, so that the effect will be further increased.

Moreover, in the case of small components, the terminals and others of the measurement jigs are arranged at a smaller pitch, whereby the leakage signal components will increase. However, in preferred embodiments of the present invention, the correction can be made at the same precision. In addition, it is possible to deal with the continued reduction in the size of components.

Furthermore, preferred embodiments of the present invention can correct the leakage signal components. Therefore, in the measurement jigs used for mass production, designing and manufacturing can be performed without concerns about the leakage signal components, so that a low-cost measurement jig having a better contact property and durability than in the past can be provided.

Here, the present invention is not limited to the above-described preferred embodiments and may include various changes.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method of correcting measurement errors by calculating, from a result of measuring electrical characteristics in a state in which an electronic component having arbitrary n ports including two or more ports is mounted on a test measurement jig, an estimated value of the electrical characteristics that would be obtained when measured in a state in which the electronic component is mounted on a base measurement jig, the method comprising:
   a first step of measuring using a measuring device the electrical characteristics in a state in which at least three first correction data obtaining samples having different electrical characteristics from each other are mounted on the base measurement jig;
   a second step of measuring using the measuring device the electrical characteristics in a state in which the at least three first correction data obtaining samples, at least three second correction data obtaining samples assumed to have electrical characteristics equivalent to those of the at least three first correction data obtaining samples, or at least one of a third correction data obtaining sample assumed to have electrical characteristics equivalent to those of a portion of the at least three first correction data obtaining samples and other ones of the first correction data obtaining samples are mounted on the test measurement jig;
   a third step of determining using the measuring device an equation that correlates, on the same electronic component, measurement values of electrical characteristics measured in a state in which the electronic component is mounted on the test measurement jig with measurement values of electrical characteristics measured in a state in which the electronic component is mounted on the base measurement jig, from a result of measurements in the first and second steps, where the equation assumes a presence of leakage signals that are directly transmitted between at least two ports of at least one of the base measurement jig and the test measurement jig without being transmitted to the electronic component connected to the two ports;
   a fourth step of measuring using the measuring device the electrical characteristics in a state in which an arbitrary electronic component is mounted on the test measurement jig; and
   a fifth step of calculating using the measuring device the electrical characteristics that would be obtained when measured in a state in which the electronic component is mounted on the base measurement jig, from a result of measurement in the fourth step by using the equation determined in the third step; wherein the equation determined in the third step is, in a relative error correction circuit network model in which identical ports are connected with each other and different ports assuming the presence of leakage signals are connected, between an S parameter at the base measurement jig and an S parameter at the test measurement jig in measurement of arbitrary n ports, a T parameter $T_{CA}'$ of the relative error correction circuit network model normalized by arbitrary one element in a T parameter $T_{CA}$ of the circuit network model that is calculated by normalizing $T_{CA}$ with the arbitrary one element in $T_{CA}$ on the following equation:

$$\begin{bmatrix} (S_{T1}^t \ I_{n\times n}) \otimes (-I_{n\times n} \ S_{D1}) \\ (S_{T2}^t \ I_{n\times n}) \otimes (-I_{n\times n} \ S_{D2}) \\ \vdots \\ (S_{Tm}^t \ I_{n\times n}) \otimes (-I_{n\times n} \ S_{Dm}) \end{bmatrix} \cdot t_{CA} = 0 \qquad \text{Equation 1}$$

$$t_{CA} = cs[T_{CA}] = \begin{pmatrix} t_{CA11} \\ t_{CA21} \\ \vdots \end{pmatrix}$$

where $\otimes$ is a Kronecker product, $cs[\ ]$ is a column expansion, the suffix t represents a transpose matrix, and $I_{n\times n}$ is an n×n unit matrix, that is represented by using:
an S parameter $S_{Dm}$ of the m-th correction data obtaining sample measurement values in the base measurement jig,
an S parameter $S_{Tm}$ of the m-th correction data obtaining sample measurement values in the test measurement jig, and
the T parameter $T_{CA}$ of the relative error correction circuit network model.

2. The method of correcting measurement errors according to claim 1, wherein
when all of the ports at which the leakage signals are present are corrected in each of the base measurement jig and the test measurement jig, electrical characteristics are measured in a state in which at least five of the first correction data obtaining samples having different electrical characteristics from each other are mounted on the base measurement jig in the first step;
electrical characteristics are measured in a state in which the at least five first correction data obtaining samples, at least five second correction data obtaining samples assumed to have electrical characteristics equivalent to those of the at least five first correction data obtaining samples, or at least one of the third correction data obtaining samples assumed to have electrical characteristics equivalent to those of a portion of the at least five first correction data obtaining samples and the other ones of the first correction data obtaining samples are mounted on the test measurement jig in the second step; and
the equation determined in the third step from the result of measurements in the first and second steps is an equation that assumes correction of the leakage signals of all of the ports in each of the base measurement jig and the test measurement jig.

3. The method of correcting measurement errors according to claim 1, wherein the equation by which the electrical characteristics are calculated in the fifth step is,
in a circuit network model in which identical ports are connected with each other and different ports assuming the presence of leakage signals are connected, between an S parameter at the base measurement jig and an S parameter at the test measurement jig in measurement of arbitrary n ports, $S_D$ calculated based on the following equation:

$$S_D = (T_{CA11}' \cdot S_T + T_{CA12}') \cdot (T_{CA21}' \cdot S_T + T_{CA22}')^{-1} \qquad \text{Equation 2}$$

that is represented by using:
an S parameter $S_D$ that would be obtained when measured in a state in which the electronic component is mounted on the base measurement jig,
an S parameter $S_T$ of the electronic component measurement values in the test measurement jig, and
square matrices $T_{CA11}'$, $T_{CA12}'$, $T_{CA21}'$, and $T_{CA22}'$ obtained by splitting the T parameter $T_{CA}'$ of the relative error correction circuit network model normalized with arbitrary one element in $T_{CA}$ of the relative error correction circuit network model calculated in the third step into n×n.

4. An electronic component characteristics measuring device that calculates, from a result of measuring electrical characteristics in a state in which an electronic component having arbitrary n ports including two or more ports is mounted on a test measurement jig, the electrical characteristics that would be obtained when measured in a state in which the electronic component is mounted on a base measurement jig, the device comprising:
an equation storing unit arranged to store an equation determined from a first measurement result obtained by measuring electrical characteristics in a state in which at least three first correction data obtaining samples having different electrical characteristics from each other are mounted on the base measurement jig and a second measurement result obtained by measuring electrical characteristics in a state in which the at least three first correction data obtaining samples, at least three second correction data obtaining samples assumed to have electrical characteristics equivalent to those of the at least three first correction data obtaining samples, or at least one of a third correction data obtaining sample assumed to have electrical characteristics equivalent to those of a portion of the at least three first correction data obtaining samples and the other ones of the first correction data obtaining samples are mounted on the test measurement jig, where the equation correlates, on the same electronic component, measurement values of electrical characteristics measured in a state in which the electronic component is mounted on the test measurement jig with measurement values of electrical characteristics measured in a state in which the electronic component is mounted on the base measurement jig, assuming a presence of leakage signals that are directly transmitted between at least two ports of at least one of the base measurement jig and the test measurement jig without being transmitted to the electronic component connected to the two ports; and
an electrical characteristics estimating unit arranged to calculate, from a result of measuring electrical characteristics in a state in which an arbitrary electronic component is mounted on the test measurement jig, the electrical characteristics that would be obtained when measured in a state in which the electronic component is mounted on the base measurement jig, by using the equation stored in the equation storing unit; wherein the equation stored by the equation storing unit is in a relative error correction circuit network model in which identical ports are connected with each other and different ports assuming presence of leakage signals are connected, between an S parameter at the base measurement jig and an S parameter at the test measurement jig in measurement of arbitrary n ports, a T parameter $T_{CA}'$ of the relative error correction circuit network model normalized by arbitrary one element in a T parameter $T_{CA}$ of the circuit network model that is calculated by normalizing $T_{CA}$ with the arbitrary one element in $T_{CA}$ on the following equation:

Equation 1

$$\begin{bmatrix} (S_{T1}^t \ I_{n\times n}) \otimes (-I_{n\times n} \ S_{D1}) \\ (S_{T2}^t \ I_{n\times n}) \otimes (-I_{n\times n} \ S_{D2}) \\ \vdots \\ (S_{Tm}^t \ I_{n\times n}) \otimes (-I_{n\times n} \ S_{Dm}) \end{bmatrix} \cdot t_{CA} = 0 \qquad \text{Equation 1}$$

$$t_{CA} = cs[T_{CA}] = \begin{pmatrix} t_{CA11} \\ t_{CA21} \\ \vdots \end{pmatrix}$$

where $\otimes$ is a Kronecker product, cs[ ] is a column expansion, the suffix t represents a transpose matrix, and $I_{n\times n}$ is an n×n unit matrix, that is represented by using:
- an S parameter $S_{Dm}$ of the m-th correction data obtaining sample measurement values in the base measurement jig,
- an S parameter $S_{Tm}$ of the m-th correction data obtaining sample measurement values in the test measurement jig, and
- the T parameter $T_{CA}$ of the relative error correction circuit network model.

5. The electronic component characteristics measuring device according to claim 4, wherein when all of the ports at which the leakage signals are present are corrected in each of the base measurement jig and the test measurement jig, the equation stored by the equation storing unit is determined from:

the first measurement result obtained by measuring the electrical characteristics in a state in which at least five of the first correction data obtaining samples having different electrical characteristics from each other are mounted on the base measurement jig; and the second measurement result obtained by measuring the electrical characteristics in a state in which the at least five first correction data obtaining samples, at least five second correction data obtaining samples assumed to have electrical characteristics equivalent to those of the at least five first correction data obtaining samples, or at least one of the third correction data obtaining samples assumed to have electrical characteristics equivalent to those of a portion of the at least five first correction data obtaining samples and the other ones of the first correction data obtaining samples are mounted on the test measurement jig, assuming correction of the leakage signals of all of the ports in each of the base measurement jig and the test measurement jig.

6. The electronic component characteristics measuring device according to claim 4, wherein the equation stored in the equation storing unit and used when the electrical characteristics estimating unit calculates, from a result of measuring electrical characteristics in a state in which an arbitrary electronic component is mounted on the test measurement jig, the electrical characteristics that would be obtained when measured in a state in which the electronic component is mounted on the base measurement jig is, in a circuit network model in which identical ports are connected with each other and different ports assuming presence of leakage signals are connected, between an S parameter at the base measurement jig and an S parameter at the test measurement jig in measurement of arbitrary n ports, $S_D$ calculated based on the following equation:

$$S_D = (T_{CA11}' \cdot S_T + T_{CA12}') \cdot (T_{CA21}' \cdot S_T + T_{CA22}')^{-1} \qquad \text{Equation 2}$$

that is represented by using:
- an S parameter $S_D$ that would be obtained when measured in a state in which the electronic component is mounted on the base measurement jig,
- an S parameter $S_T$ of the electronic component measurement values in the test measurement jig, and
- square matrices $T_{CA11}'$, $T_{CA12}'$, $T_{CA21}'$, and $T_{CA22}'$ obtained by splitting the T parameter $T_{CA}'$ of the relative error correction circuit network model normalized with arbitrary one element in $T_{CA}$ of the relative error correction circuit network model calculated from the first measurement result and the second measurement result into n×n.

* * * * *